United States Patent
Thompson et al.

(10) Patent No.: US 10,393,768 B2
(45) Date of Patent: Aug. 27, 2019

(54) MEMS DEVICE TO SELECTIVELY MEASURE EXCITATION IN DIFFERENT DIRECTIONS

(71) Applicant: INVENSENSE, INC., San Jose, CA (US)

(72) Inventors: Matthew Julian Thompson, Beaverton, OR (US); Joseph Seeger, Menlo Park, CA (US)

(73) Assignee: Invensense, Inc., San Jose, CA (US)

( * ) Notice: Subject to any disclaimer, the term of this patent is extended or adjusted under 35 U.S.C. 154(b) by 84 days.

(21) Appl. No.: 14/981,877

(22) Filed: Dec. 28, 2015

(65) Prior Publication Data

US 2017/0184627 A1  Jun. 29, 2017

(51) Int. Cl.
| | |
|---|---|
| G01P 15/125 | (2006.01) |
| G01R 33/028 | (2006.01) |
| G01P 15/12 | (2006.01) |
| G01P 15/18 | (2013.01) |
| G01P 15/08 | (2006.01) |

(52) U.S. Cl.
CPC .......... *G01P 15/123* (2013.01); *G01P 15/125* (2013.01); *G01P 15/18* (2013.01); *G01R 33/0286* (2013.01); *B81B 2203/051* (2013.01); *G01P 2015/0814* (2013.01)

(58) Field of Classification Search
CPC ................................ G01P 15/125; G01P 15/18
USPC ....................................................... 73/514.32
See application file for complete search history.

(56) References Cited

U.S. PATENT DOCUMENTS

| 7,263,460 | B2 * | 8/2007 | Fendt | B60R 21/01338 |
| | | | | 180/268 |
| 2004/0182156 | A1 * | 9/2004 | Goto | G01P 15/125 |
| | | | | 73/514.32 |
| 2006/0149451 | A1 * | 7/2006 | Maas | B60G 17/01908 |
| | | | | 701/70 |
| 2008/0011080 | A1 * | 1/2008 | Merassi | G01P 15/0891 |
| | | | | 73/510 |
| 2014/0266170 | A1 * | 9/2014 | Seeger | G01P 15/08 |
| | | | | 324/227 |

\* cited by examiner

*Primary Examiner* — John E Chapman, Jr.
(74) *Attorney, Agent, or Firm* — Minisandram Law Firm; Raghunath S. Minisandram

(57) ABSTRACT

A method and system for a sensor system of a device is disclosed. The sensor system includes a first MEMS sensor (FMEMS), a second MEMS sensor (SMEMS) and a signal processor (SP). An excitation is imparted to the device along a first axis (FA). The FMEMS has a first primary sense axis (FPSA), moves in response to a component of the excitation along the FA aligned with the FPSA and outputs a first signal proportional to an excitation along the FPSA. The SMEMS has a second primary sense axis (SPSA), moves in response to a component of the excitation along the FA aligned with the SPSA and outputs a second signal proportional to an excitation along the SPSA. The SP combines the first signal and the second signal to output a third signal proportional to the excitation along the FA. The FA, the FPSA and the SPSA have different orientations.

44 Claims, 9 Drawing Sheets

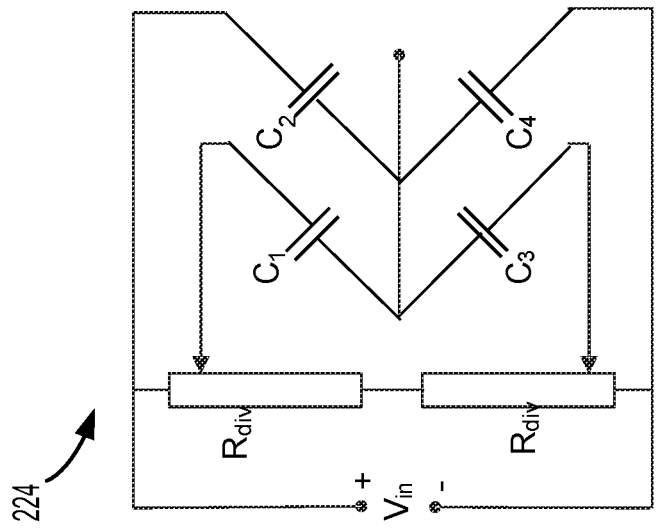
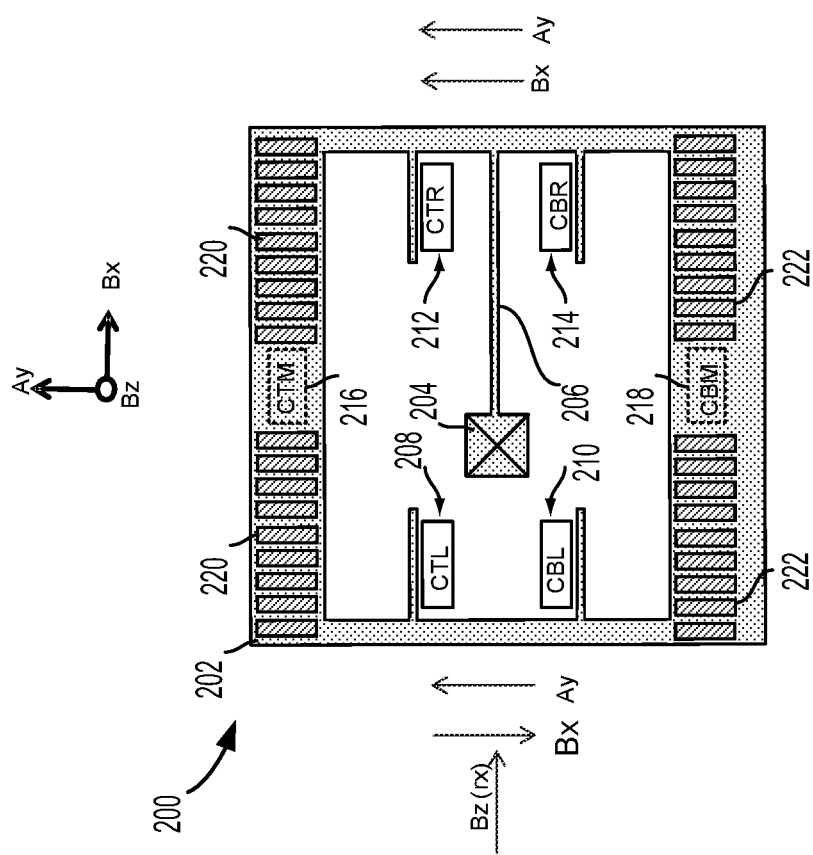
Figure 2B
Figure 2A

| EXCITATION | Vin | Vout | C1 | C2 | C2' | C1' | C3 | C4 | C4' | C3' |
|---|---|---|---|---|---|---|---|---|---|---|
| Ax | T1,T2 | T3,T4 | C23 | C24 | C15 | C16 | C25 | C26 | C13 | C14 |
| Ay | T1,T2 | T3,T4 | C23 | C24 | C13 | C14 | C25 | C26 | C15 | C16 |
| Az | T1,T2 | T3,T4 | C11 | NC | NC | C21 | C12 | NC | NC | C22 |
| Bx | T1,T2 | T3,T4 | C23 | C26 | C13 | C16 | C24 | NC | C14 | C15 |
| By | T1,T2 | T3,T4 | C23 | C26 | C14 | C15 | C24 | C25 | C13 | C16 |
| Bz | T1,T2 | T3,T4 | C11 | NC | NC | C22 | C12 | NC | NC | C21 |
| Ax | T3,T4 | T1,T2 | C23 | C24 | C15 | C16 | C25 | C26 | C13 | C14 |
| Ay | T3,T4 | T1,T2 | C23 | C24 | C13 | C14 | C25 | C26 | C15 | C16 |
| Az | T3,T4 | T1,T2 | C11 | NC | NC | C21 | C12 | NC | NC | C22 |
| Bx | T3,T4 | T1,T2 | C23 | C26 | C13 | C16 | C24 | C25 | C14 | C15 |
| By | T3,T4 | T1,T2 | C23 | C26 | C14 | C15 | C24 | C25 | C13 | C16 |
| Bz | T3,T4 | T1,T2 | C11 | NC | NC | C22 | C12 | NC | NC | C21 |

Figure 3C

MEMS DEVICE TO SELECTIVELY MEASURE EXCITATION IN DIFFERENT DIRECTIONS

TECHNICAL FIELD

The present invention relates generally to microelectromechanical systems (MEMS) device and more particularly, to a MEMS device configured to selectively measure excitation in different direction.

DESCRIPTION OF RELATED ART

MEMS devices are formed using various semiconductor manufacturing processes. MEMS devices may have fixed and movable portions. MEMS force sensors have one or more sense material, which react to an external influence imparting a force onto the movable portions. The sense material can be the MEMS structural layer or a deposited layer. The MEMS force sensor may be configured to measure these movements induced by the external influence to determine the type and extent of the external influence.

MEMS devices may include one or more movable portions coupled to one or more springs. Sometimes, large external acceleration or shock may impart undesirable movements of the movable portions. These undesirable movements may induce false measurements or introduce errors into the measurement capabilities of the MEMS device. It may be desirable to minimize the impact of extraneous forces or stress on operation of the MEMS device.

With these needs in mind, the current disclosure arises. This brief summary has been provided so that the nature of the disclosure may be understood quickly. A more complete understanding of the disclosure can be obtained by reference to the following detailed description of the various embodiments thereof in connection with the attached drawings.

SUMMARY OF THE INVENTION

In one embodiment, a method for determining excitation imparted to a device is disclosed. A sensor system with a first MEMS sensor, a second MEMS sensor and a signal processor is provided. An excitation is imparted to the sensor system along a first axis. The first MEMS sensor has a first primary sense axis and is configured to output a first signal proportional to the excitation of the sensor system along the first primary sense axis. The first sensor moves in response to a component of the excitation along the first axis that is aligned with the first primary sense axis. The second MEMS sensor has a second primary sense axis and is configured to output a second signal proportional to the excitation of the sensor system along the second primary sense axis. The second sensor moves in response to a component of the excitation along the first axis that is aligned with the second primary sense axis. The first signal and the second signal are combined by the signal processor to output a third signal proportional to the excitation of the sensor system along the first axis, wherein the first axis, the first primary axis and the second primary axis have different orientations.

In yet another embodiment, a method for a sensor system is disclosed. A first MEMS sensor, a second MEMS sensor and a signal processor is provided. The sensor system is excited along a first axis. The first MEMS sensor has at least a first sense axis and a second sense axis. The first MEMS sensor also has a first plurality of sensing devices that is selectively configured to output a signal that is proportional to excitation along one of the at least the first sense axis and the second sense axis. The second MEMS sensor has at least a third sense axis and a fourth sense axis. The second MEMS sensor also has a second plurality of sensing devices that is selectively configured to output a signal that is proportional to excitation along one of the at least the third sense axis and the fourth sense axis. The first axis, the first sense axis and the third sense axis all have different orientations or different physical excitations. The first plurality of sensing devices and the second plurality of sensing devices are configured by the signal processor to output a first signal proportional to the excitation of the sensor system along the first axis.

In yet another embodiment, a system is disclosed. The system includes a sensor system with a first MEMS sensor, a second MEMS sensor and a signal processor is provided. An excitation is imparted to the sensor system along a first axis. The first MEMS sensor has a first primary sense axis and is configured to output a first signal proportional to the excitation of the sensor system along the first primary sense axis. The first sensor moves in response to a component of the excitation along the first axis that is aligned with the first primary sense axis. The second MEMS sensor has a second primary sense axis and is configured to output a second signal proportional to the excitation of the sensor system along the second primary sense axis. The second sensor moves in response to a component of the excitation along the first axis that is aligned with the second primary sense axis. The first signal and the second signal are combined by the signal processor to output a third signal proportional to the excitation of the sensor system along the first axis, wherein the first axis, the first primary axis and the second primary axis have different orientations.

In yet another embodiment, a sensor system is disclosed. The sensor system includes a first MEMS sensor, a second MEMS sensor and a signal processor. The sensor system is excited along a first axis. The first MEMS sensor has at least a first sense axis and a second sense axis. The first MEMS sensor also has a first plurality of sensing devices that is selectively configured to output a signal that is proportional to excitation along one of the at least the first sense axis and the second sense axis. The second MEMS sensor has at least a third sense axis and a fourth sense axis. The second MEMS sensor also has a second plurality of sensing devices that is selectively configured to output a signal that is proportional to excitation along one of the at least the third sense axis and the fourth sense axis. The first axis, the first sense axis and the third sense axis all have different orientations or different physical excitations. The first plurality of sensing devices and the second plurality of sensing devices are configured by the signal processor to output a first signal proportional to the excitation of the sensor system along the first axis.

This brief summary is provided so that the nature of the disclosure may be understood quickly. A more complete understanding of the disclosure can be obtained by reference to the following detailed description of the preferred embodiments thereof in connection with the attached drawings.

BRIEF DESCRIPTION OF THE DRAWINGS

The foregoing and other features of several embodiments are described with reference to the drawings. In the drawings, the same components have the same reference numerals. The illustrated embodiments are intended to illustrate but not limit the invention. The drawings include the following Figures:

FIG. 2A shows an example sensor assembly, according to one aspect of the present disclosure;

FIG. 2B shows an example half Wheatstone bridge configuration for sensors of sensor assembly of FIG. 2A, according to one aspect of the present disclosure;

FIG. 3C shows a table showing various example sensor configurations for two sensor assembly of FIG. 3A;

DETAILED DESCRIPTION

To facilitate an understanding of the adaptive aspects of the present disclosure, an example MEMS device configured to measure excitation in at least one axis is described. Adaptive aspects of this example is further described with respect to another example MEMS device which may be configured to measure excitation in more than one axis.

Figure 1:
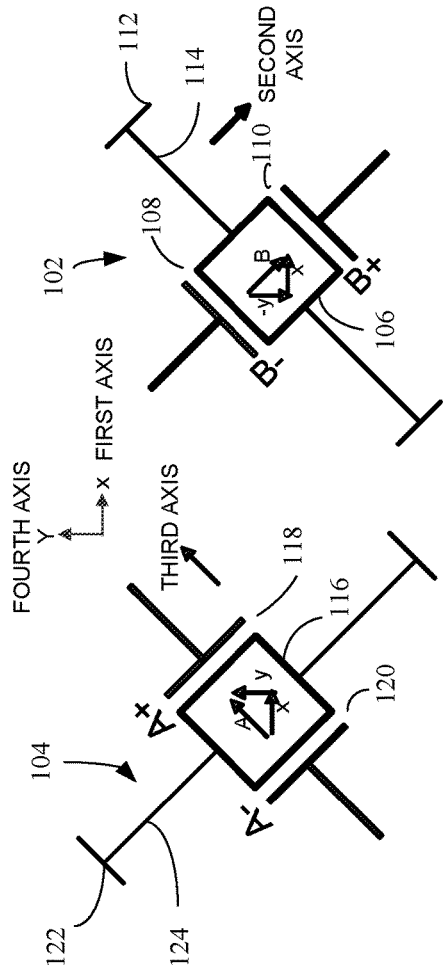
FIG. 1 shows a MEMS device, according to one aspect of the present disclosure.

FIG. 1 shows a MEMS device 100, in accordance with an embodiment of this disclosure. The MEMS device 100 includes a first MEMS sensor 102 and a second MEMS sensor 104. Preferred measurement of an excitation for the MEMS device 100 is along a first axis and a fourth axis orthogonal to the first axis. In some example, the first axis may correspond to an X axis and the fourth axis may correspond to a Y axis. In one example, the first MEMS sensor 102 is configured to measure an excitation along a second axis, second axis different than the first axis and the fourth axis. Sometimes, the second axis may be referred to as a first primary sense axis. The second MEMS sensor 104 is configured to measure an excitation along a third axis, the third axis different than the first axis, second axis and the fourth axis. Sometimes, the third axis may be referred to as a second primary sense axis.

The first MEMS sensor 102 includes a first proof mass 106, a first sensing device 108 and a second sensing device 110. The first proof mass 106 is movably coupled to a first anchor 112. For example, a first spring 114 couples the first proof mass 106 to the first anchor 112. Upon imparting an excitation, for example, along the second axis, the first proof mass 106 may move along the second axis. In one example, the first sensing device 108 and the second sensing device 110 may be capacitive sensing device. One of the electrodes of the first sensing device 108 and the second sensing device 110 may be stationary and another of the electrodes of the first sensing device 108 and the second sensing device 110 may be formed over a portion of the first proof mass 106. Upon imparting excitation, for example, along the second axis, a gap between the electrodes of the first sensing device 108 may increase and a gap between the electrodes of the second sensing device 110 may reduce. As one skilled in the art appreciates, a change in the gap between electrodes of a capacitive sensor changes corresponding capacitance value of the capacitive sensor.

In one example, the first MEMS sensor 102 is configured such that an excitation B along the second axis has a corresponding excitation component along the X axis and negative Y axis.

The second MEMS sensor 104 includes a second proof mass 116, a third sensing device 118 and a fourth sensing device 120. The second proof mass 116 is movably coupled to a second anchor 122. For example, a second spring 124 couples the second proof mass 116 to the second anchor 122. Upon imparting an excitation, for example, along the third axis, the second proof mass 116 may move along the third axis. In one example, the third sensing device 118 and the fourth sensing device 120 may be capacitive sensing device. One of the electrodes of the third sensing device 118 and the fourth sensing device 120 may be stationary and another of the electrodes of the third sensing device 118 and the fourth sensing device 120 may be formed over a portion of the second proof mass 116. Upon imparting excitation, for example, along the third axis, a gap between the electrodes of the third sensing device 118 may increase and a gap between the electrodes of the fourth sensing device 120 may reduce. As one skilled in the art appreciates, a change in the gap between electrodes of a capacitive sensor changes corresponding capacitance value of the capacitive sensor.

In one example, the first MEMS sensor 102 is configured such that an excitation B along the second axis has a corresponding excitation component along the positive X axis and negative Y axis. The second MEMS sensor 104 is configured such that an excitation A along the third axis has a corresponding excitation component along the positive X axis and positive Y axis. As one skilled in the art appreciates, by selectively configuring the first MEMS sensor 102 and second MEMS sensor 104 in this manner may be advantageously used to measure excitation along two axes, for example, X axis and Y axis. In one example, the X axis corresponds to the first axis and the Y axis corresponds to the fourth axis. An example first sense circuit 130-1 will now be described with reference to FIG. 1A to measure excitation along X axis. Later, another example second sense circuit 130-2 will be described with reference to FIG. 1B to measure excitation along Y axis.

Figure 1A:
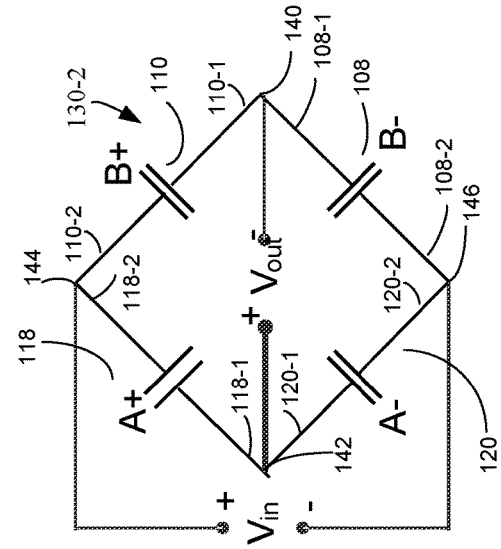
FIG. 1A shows an example first sense circuit to measure excitation along X axis, according to one aspect of the present disclosure.

Now, referring to FIG. 1A, an example first sense circuit 130-1 to measure excitation along X axis is described. In this example, the first sensing device 108, second sensing device 110, third sensing device 118 and the fourth sensing device 120 are selectively coupled to form a Wheatstone bridge configuration. More specifically, a first end 108-1 of the first sensing device 108 and a first end 110-1 of the second sensing device 110 are coupled together at a first junction 132. The first end 118-1 of the third sensing device 118 and the first end 120-1 of the fourth sensing device 120 are coupled together at a second junction 134. A second end 108-2 of the first sensing device 108 and a second end 118-2 of the third sensing device 118 are coupled together at a third junction 136. A second end 110-2 of the second sensing device 110 and a second end 120-2 of the fourth sensing device 120 are coupled together at a fourth junction 138. An input voltage Vin is applied between the third junction 136 and the fourth junction 138. An output voltage Vout is measured between the first junction 132 and the second junction 134. A first signal generated by the first MEMS sensor 102 is indicative of the excitation B, with a positive X component and a negative Y component. A second signal generated by the second MEMS sensor 104 is indicative of the excitation A, with a positive X component and a positive Y component. A ratio of the output voltage Vout to input voltage Vin will provide a third signal, the value of which is indicative of the excitation along the X axis. As one skilled in the art appreciates, in this configuration, the ratio of Vout to input voltage Vin is indicative of the sum of the excitation A and B. In other words, addition of the first signal and the second signal. As excitation A has positive Y component and excitation B has a negative Y component, the sum of excitation A and B (third signal) will result in a value indicative of the excitation along the X axis.

Figure 1B:
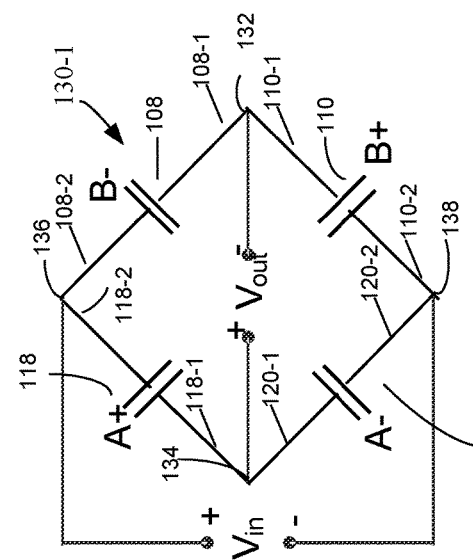
FIG. 1B shows an example second sense circuit to measure excitation along Y axis, according to one aspect of the present disclosure.

Now, referring to FIG. 1B, an example second sense circuit 130-2 to measure excitation along Y axis is described. In this example, the first sensing device 108, second sensing device 110, third sensing device 118 and the fourth sensing device 120 are selectively coupled to form a Wheatstone bridge configuration. More specifically, a first end 108-1 of the first sensing device 108 and a first end 110-1 of the second sensing device 110 are coupled together at a fifth junction 140. A first end 118-1 of the third sensing device 118 and a first end 120-1 of the fourth sensing device 120 are coupled together at a sixth junction 142. A second end 110-2 of the second sensing device 110 and a second end 118-2 of the third sensing device 118 are coupled together at a seventh junction 144. A second end 108-2 of the first sensing device 108 and a second end 120-2 of the fourth sensing device 120 are coupled together at an eighth junction 146. An input voltage Vin is applied between the seventh junction 144 and the eighth junction 146. An output voltage Vout is measured between the fifth junction 140 and the sixth junction 142. As previously described, the first signal generated by the first MEMS sensor 102 is indicative of the excitation B, with a positive X component and a negative Y component. The second signal generated by the second MEMS sensor 104 is indicative of the excitation A, with a positive X component and a positive Y component. A ratio of the output voltage Vout to input voltage Vin will provide a fourth signal, the value of which is indicative of the excitation along the Y axis. As one skilled in the art appreciates, in this configuration, the ratio of Vout to input voltage Vin is indicative of the difference between the excitation A and B. As excitation A and excitation B both have positive X components, the difference between excitation A and B will result in a value indicative of the excitation along the Y axis, with the cancellation of X component.

When constructing a MEMS sensor, for example, using single crystal silicon, it is advantageous to construct springs on the low Elastic modulus axis. A spring with a certain stiffness, constructed on the low Elastic modulus axis will have a wider width than the same stiffness spring on the high Elastic modulus axis. The wider width spring is preferable, as it is more robust to fabrication imperfections. Further, in some examples, wider width spring may survive shock better, for example, shock caused when the sensor is dropped. It is common in MEMS applications to align the high Elastic modulus axis of single crystal silicon with sensor axes X and Y. Such a configuration results in a low Elastic modulus along an axis that is at +45 degree and −45 degree with respect to the sensor axes. In some examples, it is advantageous to construct MEMS sensors to sense the +45 degree and −45 degree axes, as they may be more robust to fabrication imperfections and survive excessive shock.

As an example, referring back to FIG. 1, second axis may correspond to an axis that is −45 degrees with respect to X axis and third axis may correspond to an axis that is +45 degrees with respect to X axis. Now, referring to FIG. 1C, for capacitors C1, C2, C3 and C4 configured in a Wheatstone bridge configuration 130-3 as shown, the following equation applies:

$$\frac{V_{out}}{V_{in}} = \frac{C_1}{C_1 + C_3} - \frac{C_2}{C_2 + C_4} \qquad \text{Equation 1}$$

Now, referring back to FIG. 1, if the capacitance values for first sensing device is represented as B−, second sensing device is represented as B+, third sensing device is represented as A+ and fourth sensing device is represented as A− and nominal capacitance value for these capacitors is C (with no external influence), then due to an external influence, the capacitance values for capacitance A+, A−, B+ and B− would change as follows:

$$C_{A+} = C + \frac{dC}{dX}X + \frac{dC}{dY}Y \qquad \text{Equation 2}$$

$$C_{A-} = C - \frac{dC}{dX}X - \frac{dC}{dY}Y \qquad \text{Equation 3}$$

$$C_{B+} = C + \frac{dC}{dX}X - \frac{dC}{dY}Y \qquad \text{Equation 4}$$

$$C_{B-} = C - \frac{dC}{dX}X + \frac{dC}{dY}Y \qquad \text{Equation 5}$$

Figure 1C:
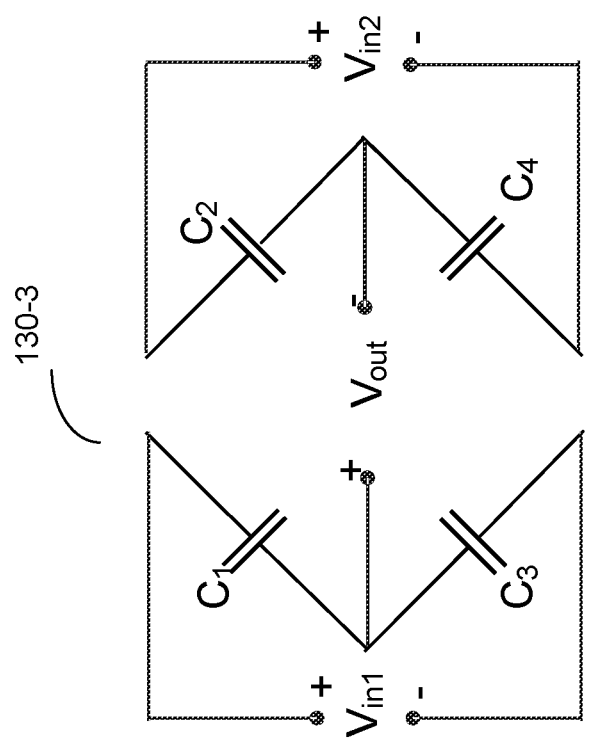
FIG. 1C shows an example Wheatstone bridge configuration of sensors, according to one aspect of the present disclosure.

Now, referring to Wheatstone bridge configuration of FIG. 1A and comparing with the Wheatstone bridge configuration shown in FIG. 1C, CA+ corresponds to C1, CB− corresponds to C2, CA− corresponds to C3 and CB+ corresponds to C4.

Applying the corresponding values for C1, C2, C3 and C4 in Equation 1, we derive that $$\frac{V_{out}}{V_{in}} = \frac{1}{C}\frac{dC}{dX}X \qquad \text{Equation 6}$$

In other words, for the Wheatstone bridge configuration shown in FIG. 1A, the Vout/Vin is proportional to the excitation along the X axis.

Now, referring to Wheatstone bridge configuration of FIG. 1B and comparing with the Wheatstone bridge configuration shown in FIG. 1C, CA+ corresponds to C1, CB+ corresponds to C2, CA− corresponds to C3 and CB− corresponds to C4.

Applying the corresponding values for C1, C2, C3 and C4 in Equation 1, we derive that $$\frac{V_{out}}{V_{in}} = \frac{1}{C}\frac{dC}{dY}Y \qquad \text{Equation 7}$$

In other words, for the Wheatstone bridge configuration shown in FIG. 1B, the Vout/Vin is proportional to the excitation along the Y axis.

As one skilled in the art appreciates, in the example equations described above, the ratio dC/dX and dC/dY (rate of change of capacitance due to component of excitation along X axis and Y axis respectively) is assumed to be same for all the capacitors. If there is a mismatch in the rate of change of capacitance, then an error in measurement is introduced. If we assume a difference in sensitivity of $\alpha$ between capacitors, then, $$C_{A+} = C + (1 + \alpha/2)\left(\frac{dC}{dX}X + \frac{dC}{dY}Y\right) \quad \text{Equation 8}$$

$$C_{A-} = C - (1 + \alpha/2)\left(\frac{dC}{dX}X + \frac{dC}{dY}Y\right) \quad \text{Equation 9}$$

$$C_{B+} = C + (1 - \alpha/2)\left(\frac{dC}{dX}X - \frac{dC}{dY}Y\right) \quad \text{Equation 10}$$

$$C_{B-} = C - (1 - \alpha/2)\left(\frac{dC}{dX}X - \frac{dC}{dY}Y\right) \quad \text{Equation 11}$$

For $C_1=C_{A+}$, $C_3=C_{A-}$, $C_2=C_{B-}$, $C_4=C_{B+}$ for a Wheatstone bridge as configured in FIG. 1B, $$\frac{V_{out}}{V_{in}} = \frac{1}{C}\left(\frac{dC}{dX}X + \frac{\alpha}{2}\frac{dC}{dY}Y\right) \quad \text{Equation 12}$$

For $C_1=C_{A+}$, $C_3=C_{A-}$, $C_2=C_{B+}$, $C_4=C_{B-}$ for a Wheatstone bridge as configured in FIG. 1C, $$\frac{V_{out}}{V_{in}} = \frac{1}{C}\left(\frac{dC}{dY}Y + \frac{\alpha}{2}\frac{dC}{dX}X\right) \quad \text{Equation 13}$$

Figure 1D:
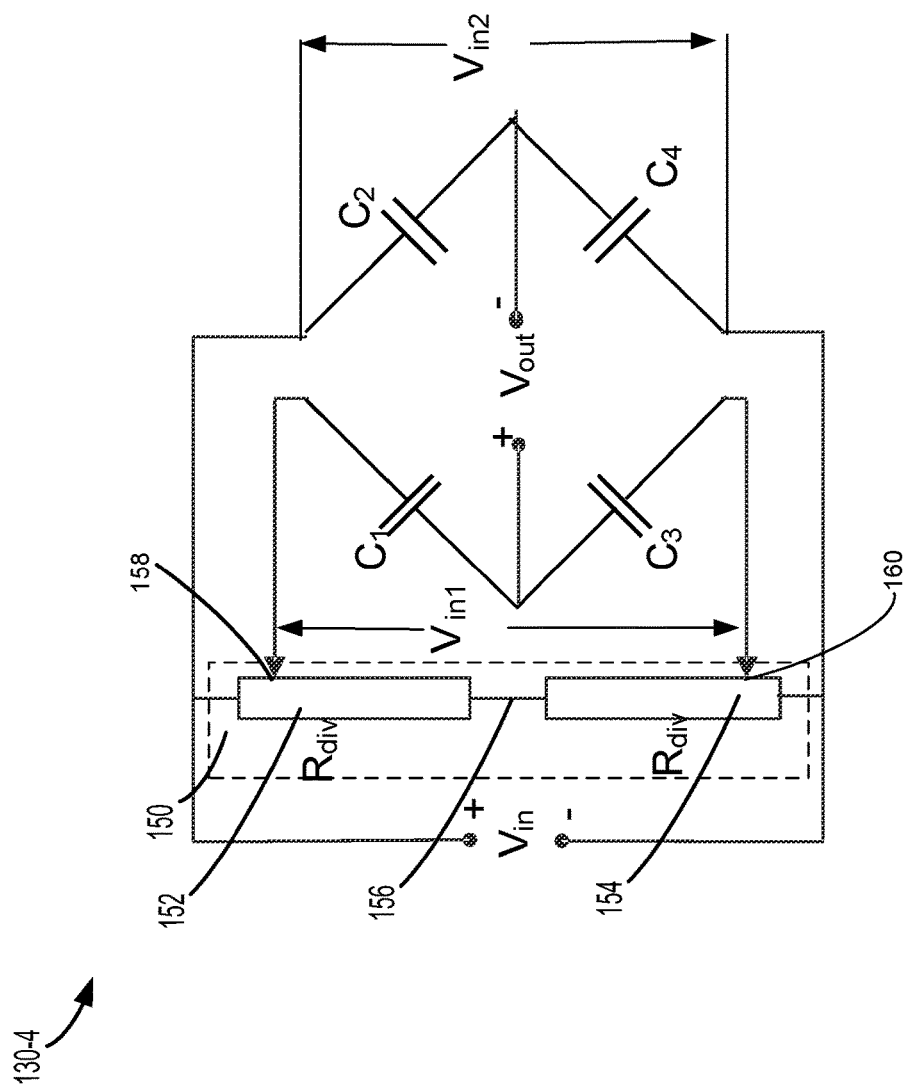
FIG. 1D shows an example modified Wheatstone bridge configuration of sensors, according to one aspect of the present disclosure.

In Equation 12, the term $$\frac{\alpha}{2}\frac{dC}{dX}$$

and in Equation 13, the term $$\frac{\alpha}{2}\frac{dC}{dY}$$

may be referred to as a cross axis term. If the capacitors were perfectly matched, then, the cross axis term would be zero. To remove the cross axis term, in one example, a modified Wheatstone bridge 130-4 as shown in FIG. 1D is used, where each side of the bridge is driven with different voltage, for example, $V_{in1}$ and $V_{in2}$. Then, $$V_{out} = \frac{C_1}{C_1 + C_3}V_{in1} - \frac{C_2}{C_2 + C_4}V_{in2} \quad \text{Equation 14}$$

By selecting $V_{in1}$ and $V_{in2}$ to be $$V_{in1} = \frac{V_{in}}{(1 + \alpha/2)} \quad \text{Equation 15}$$

$$V_{in2} = \frac{V_{in}}{(1 - \alpha/2)} \quad \text{Equation 16}$$

and applying $V_{in1}$ and $V_{in2}$ to the modified Wheatstone bridge 130-3 of FIG. 1D, For $C_4=C_{A+}$, $C_3=C_{A-}$, $C_2=C_{B-}$, $C_4=C_{B+}$ (as shown in FIG. 1B configuration)

$$\frac{V_{out}}{V_{in}} = \frac{1}{C}\left(\frac{dC}{dX}X + \frac{2\alpha}{\alpha^2 + 4}\right) \quad \text{Equation 17}$$

For $C_1=C_{A+}$, $C_3=C_{A-}$, $C_2=C_{B+}$, $C_4=C_{B-}$ (as shown in FIG. 1C configuration)

$$\frac{V_{out}}{V_{in}} = \frac{1}{C}\left(\frac{dC}{dY}Y + \frac{2\alpha}{\alpha^2 + 4}\right) \quad \text{Equation 18}$$

Now, referring to Equation 17 and Equation 18, the output of the modified Wheatstone bridge has a component that is proportional to excitation and a constant term $$\frac{2\alpha}{\alpha^2 + 4}.$$

The constant term $$\frac{2\alpha}{\alpha^2 + 4}$$

is preferable over the cross axis term $$\frac{\alpha}{2}\frac{dC}{dX} \text{ and } \frac{\alpha}{2}\frac{dC}{dY}$$

if the cross axis term is large. In some examples, the cross axis sensitivity may be less than a threshold value. If the cross axis term is greater than a threshold value, then the modified Wheatstone bridge configuration shown in FIG. 1E may be preferable. In some examples, the threshold value may be less than or equal to 1%.

Now, referring to FIG. 1D, an example modified Wheatstone bridge 130-4 is shown with two input voltages, $V_{in1}$ and $V_{in2}$. The voltages $V_{in1}$ and $V_{in2}$ may be generated from a single voltage source, for example, Vin, by using a voltage divider 150. The voltage divider 150 may include a variable resistor divider, with a first resistor portion 152 and a second resistor portion 154 coupled in series at junction 156. Voltage Vin is applied across the voltage divider 150. Voltage Vin is applied as $V_{in2}$ across capacitors C2 and C4. A portion of the voltage Vin is applied as $V_{in1}$ across capacitors C1 and C3. For example, a voltage across the first tap 158 of first resistor portion 152 and the second tap 160 of second resistor portion 154 is applied as $V_{in1}$ across capacitors C1 and C3. In one example, the first tap 158 and the second tap 160 are chosen such that the voltage between the junction 156 and the first tap 158 is same as the voltage between the junction 156 and the second tap 160. In other words, the junction 156 has half the voltage of $V_{in1}$.

Now, referring to FIG. 2A, an example sensor assembly 200 is shown. The sensor assembly 200 is configured to be a magnetometer and accelerometer combination sensor. The sensor assembly 200 measures both acceleration in the Y axis and magnetic field in the X axis and Z axis. In this example, for an acceleration Ay along Y axis, the proof mass 202 is configured to move up, along positive Y direction. For a magnetic excitation Bx along the X axis, the proof mass 202 rotates in plane about the Z axis. For a magnetic excitation Bz along the Z axis, the proof mass 202 rotates out of plane about the X axis.

The sensor assembly 200 is movably coupled to an anchor 204 via spring 206. Four capacitors CTL 208, CBL 210, CTR 212 and CBR 214 are formed in the sensor assembly 200. Further two capacitors CTM 216 and CBM 218 are formed in the sensor assembly 200. A first permanent magnet 220 and a second permanent magnet 222 are disposed over the proof mass 202. Due to external influence, the values of the capacitors CTL 208, CBL 210, CTR 212, CBR 214, CTM 216 and CBM 218 selectively change. Change in the capacitance value is measured to determine the extent of the external influence. For example, the capacitors may be selectively configured as part of a Wheatstone bridge, an input voltage is applied and output voltage is measured to determine the value of the excitation, as previously described.

Due to manufacturing variations, the rotation center of the proof mass 202 may not align with the center of the capacitors, which means capacitors CTL 208 and CBL 210 see a different response than the capacitors CTR 212 and CBR 214. In other words, an acceleration in the Y axis may indicate a false X axis magnetic signal. And, a magnetic field along X axis may indicate a false Y axis acceleration signal. In some examples, this error may be referred to as a cross domain error.

FIG. 2B shows an example half Wheatstone bridge 224. A second half Wheatstone bridge may be used to configure a complete Wheatstone bridge (not shown). In some examples, the second half Wheatstone bridge may include capacitors formed on another sensor. In some examples, the second half Wheatstone bridge may include capacitors formed on a separate substrate, for example, a CMOS substrate. Now, if all the capacitors have a nominal capacitance value of C, then, $$C_{TL} = C + (1 + \alpha/2)\left(\frac{dC}{dY}Y - \frac{dC}{dB_x}B_x\right)$$ Equation 19

$$C_{TR} = C - (1 + \alpha/2)\left(\frac{dC}{dY}Y + \frac{dC}{dB_x}B_x\right)$$ Equation 20

$$C_{BL} = C + (1 - \alpha/2)\left(\frac{dC}{dY}Y - \frac{dC}{dB_x}B_x\right)$$ Equation 21

$$C_{BR} = C - (1 - \alpha/2)\left(\frac{dC}{dY}Y + \frac{dC}{dB_x}B_x\right)$$ Equation 22

Selecting $V_{in1}$ and $V_{in}$ to be the same $V_{in}$,
For $C_1 = C_{TL}$, $C_3 = C_{BL}$, $C_2 = C_{TR}$, $C_4 = C_{BR}$ $$\frac{V_{out}}{V_{in}} = \frac{1}{2C}\left(\frac{dC}{dY}Y - \frac{\alpha}{2}\frac{dC}{dB_x}B_x\right) + \frac{1}{2}$$ Equation 23

For $C_1 = C_{BL}$, $C_3 = C_{TL}$, $C_2 = C_{TR}$, $C_4 = C_{BR}$ $$\frac{V_{out}}{V_{in}} = \frac{1}{2C}\left(\frac{dC}{dB_x}B_x - \frac{\alpha}{2}\frac{dC}{dY}Y\right) + \frac{1}{2}$$ Equation 24

If by selecting different voltages $V_{in1}$ and $V_{in2}$, as previously discussed, $$V_{in1} = \frac{V_{in}}{(1 + \alpha/2)}$$ Equation 25

$$V_{in2} = \frac{V_{in}}{(1 - \alpha/2)}$$ Equation 26

For $C_1 = C_{TL}$, $C_3 = C_{BL}$, $C_2 = C_{TR}$, $C_4 = C_{BR}$ $$\frac{V_{out}}{V_{in}} = \frac{1}{2C}\frac{dC}{dY}Y + \frac{2}{4 - \alpha^2}$$ Equation 27

For $C_1 = C_{BL}$, $C_3 = C_{TL}$, $C_2 = C_{TR}$, $C_4 = C_{BR}$ $$\frac{V_{out}}{V_{in}} = \frac{1}{2C}\frac{dC}{dB_x}B_x + \frac{2}{4 - \alpha^2}$$ Equation 28

Now, referring to Equation 27 and Equation 28, we see that by selectively selecting the capacitors for the construction of the Wheatstone bridge, we can measure the acceleration component along Y axis or magnetic field Bx respectively, with the addition of constant $$\frac{2}{4 - \alpha^2}.$$

If the cross domain component is greater than a threshold value, then, it is preferable to have the constant term in the equation rather than a cross domain component. In some examples, the cross domain component threshold value may be less than or equal to 1%.

Now, referring back to FIG. 2A, due to a magnetic field along Z axis, the sensor assembly 200 will rotate about the X axis, causing capacitors CTM and CBM to change. In some examples, the proof mass 202 may have a mass imbalance about the X axis. For example, the permanent magnet 220 and permanent magnet 222 may be so formed to induce a mass imbalance. When an external acceleration is induced along the Y axis, the proof mass 202 will rotate about the X axis, due to the mass imbalance. This rotation causes capacitors CTM and CBM to change, indicating a spurious magnetic influence along the Z axis. This may be sometimes referred to as cross domain coupling. In one example, to eliminate the cross domain coupling from acceleration along Y axis to Z axis magnetic sensors, a Wheatstone circuit similar to the Wheatstone circuit described with reference to FIG. 1E may be used.

For a nominal capacitance value of C, $$C_{TLR} = \frac{C_{TL} + C_{TR}}{2} = C + \frac{dC}{dY}Y$$ Equation 29 where $C_{TLR}$ is the effective capacitance of capacitors CTL and CTR.

$$C_{BLR} = \frac{C_{BL} + C_{BR}}{2} = C - \frac{dC}{dY}Y \quad \text{Equation 30}$$

where $C_{BLR}$ is the effective capacitance of capacitors CBL and CBR.

$$C_{TM} = C + \left(\frac{dC}{dB_z}B_z + \beta\frac{dC}{dY}Y\right) \quad \text{Equation 31}$$

$$C_{BM} = C - \left(\frac{dC}{dB_z}B_z + \beta\frac{dC}{dY}Y\right) \quad \text{Equation 32}$$

In the above equation, β corresponds to the cross domain component of Y acceleration causing an RX rotation and that is detected by the $C_{TM}$ and $C_{BM}$ capacitors. Now, using two different voltages $V_{in1}$ and $V_{in2}$, as previously described with reference to FIG. 1E, $$V_{out} = \frac{C_1 V_{in1} + C_2 V_{in2}}{C_1 + C_2 + C_3 + C_4} \quad \text{Equation 33}$$

and selecting $V_{in1} = \beta V_{in}$, $V_{in2} = V_{in}$ $$\frac{V_{out}}{V_{in}} = \frac{1}{2}\left(\frac{dC}{dB_z}B_z + 1 - \beta\right) \quad \text{Equation 34}$$

By selecting the correct voltages $V_{in1}$ and $V_{in2}$ a portion of the sense electrodes that are sensitive to Y acceleration can be used to cancel the cross domain if present in the $C_{TM}$ and $C_{BM}$ electrodes. In some examples, the cross-domain component may be eliminated, if the cross-domain component is above a threshold value. In some examples, the cross-domain component threshold value may be less than or equal to 1%.

Figure 3A:
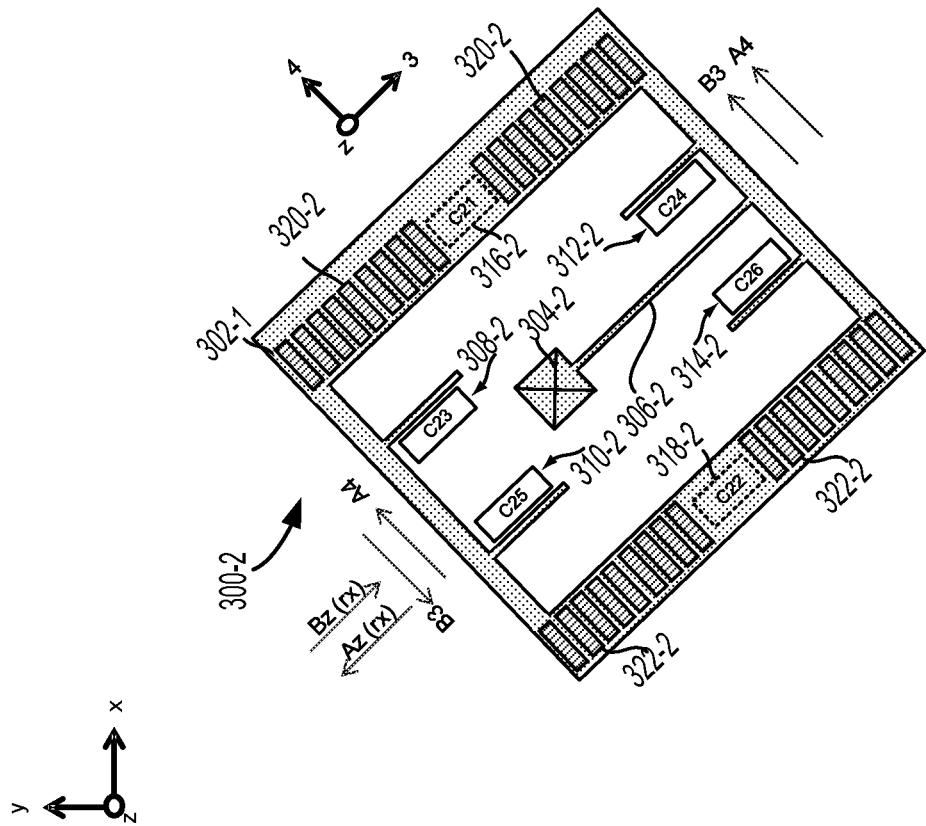
FIG. 3A shows an example two sensor assemblies, according, according to one aspect of the present disclosure.
Figure 3A:
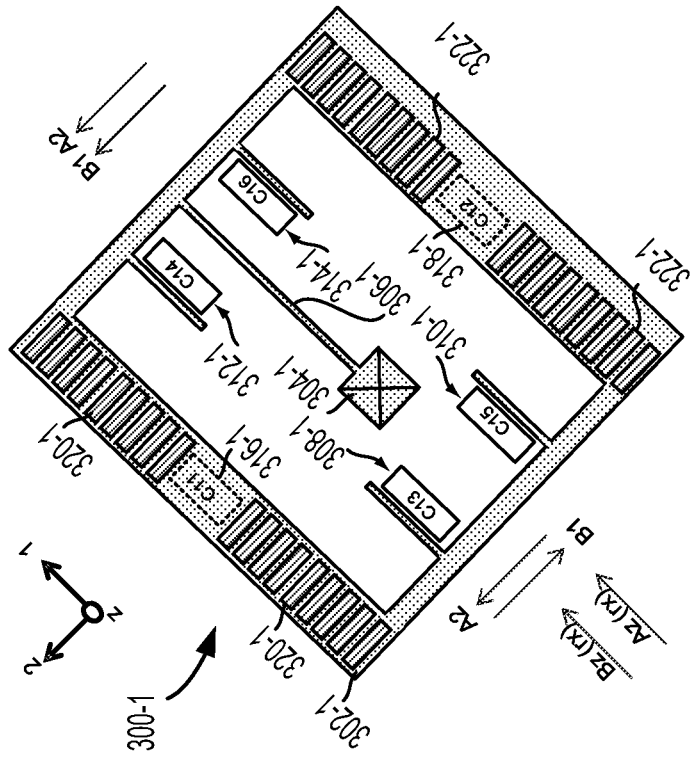

Having described a sensor assembly 200 with reference to FIG. 2A and a corresponding half Wheatstone bridge 224 with reference to FIG. 2B, which can measure external influence in three axis, now a two sensor combination to measure external influence in six axis is described with reference to two sensor assemblies, for example, first sensor assembly 300-1 and second sensor assembly 300-2 as shown in FIG. 3A and a full Wheatstone bridge 324 as shown with reference to FIG. 3B.

Referring to FIG. 3A, first sensor assembly 300-1 and second sensor assembly 300-2 are shown. First sensor assembly 300-1 and second sensor assembly 300-2 may be similar to sensor assembly 200, except that first sensor assembly 300-1 is oriented along axis 1 and axis 2, whereas second sensor assembly 300-2 is oriented along axis 3 and axis 4. The first sensor assembly 300-1 is configured to be a magnetometer and accelerometer combination sensor. The first sensor assembly 300-1 measures both acceleration in the Y axis and Z axis and magnetic field in the X axis and Z axis. In this example, for an acceleration A2 along axis 2, the proof mass 302-1 is configured to move up, along positive axis 2 direction. For a magnetic excitation B1 along axis 1, the proof mass 302-1 rotates in plane about the Z axis. For a magnetic excitation Bz along the Z axis, the proof mass 202 rotates out of plane about the positive axis 1. For an acceleration Az along the Z axis the proof mass 202 rotates about the positive axis 1.

The second sensor assembly 300-2 is also configured to be a magnetometer and accelerometer combination sensor. The second sensor assembly 300-2 measures both acceleration in the Y axis and magnetic field in the X axis and Z axis. In this example, for an acceleration A4 along axis 4, the proof mass 302-2 is configured to move up, along positive axis 4 direction. For a magnetic excitation B3 along axis 3, the proof mass 302-2 rotates in plane about the Z axis. For a magnetic excitation Bz along the Z axis, the proof mass 302-2 rotates out of plane about positive axis 3. For an acceleration along the Z axis the proof mass 202 rotates in the negative axis 3.

The first sensor assembly 300-1 is movably coupled to an anchor 304-1 via spring 306-1. Four capacitors C13 308-1, C15 310-1, C14 312-1 and C16 314-1 are formed in the first sensor assembly 300-1. Further two capacitors C11 316-1 and C12 318-1 are formed in the first sensor assembly 300-1. A first permanent magnet 320-1 and a second permanent magnet 322-1 are disposed over the proof mass 302-1. Due to external influence, the values of the capacitors C13 308-1, C15 310-1, C14 312-1, C16 314-1, C11 316-1 and C12 318-1 selectively change. Change in the capacitance value is measured to determine the extent of the external influence. For example, the capacitors may be selectively configured as part of a Wheatstone bridge, an input voltage is applied and output voltage is measured to determine the value of the excitation, as previously described.

In some examples, capacitors C11 316-1 and C12 318-1 of first sensor assembly 300-1 correspond to capacitors CTM 216 and CBM 218 of sensor assembly 200-1 respectively. Capacitors C13 308-1 and C14 312-1 of first sensor assembly 300-1 correspond to capacitors CTL 208 and CTR 212 of sensor assembly 200-1 respectively. Capacitors C15 310-1 and C16 314-1 of first sensor assembly 300-1 correspond to capacitors CBL 210 and CBR 214 of sensor assembly 200-1 respectively.

The second sensor assembly 300-2 is movably coupled to an anchor 304-2 via spring 306-2. Four capacitors C23 308-2, C25 310-2, C24 312-2 and C26 314-2 are formed in the second sensor assembly 300-2. Further two capacitors C21 316-2 and C22 318-2 are formed in the sensor assembly 300-2. A first permanent magnet 320-2 and a second permanent magnet 322-2 are disposed over the proof mass 302-2. Due to external influence, the values of the capacitors C23 308-2, C25 310-2, C24 312-2, C26 314-2, C21 316-2 and C22 318-2 selectively change. Change in the capacitance value is measured to determine the extent of the external influence. For example, the capacitors may be selectively configured as part of a Wheatstone bridge, an input voltage is applied and output voltage is measured to determine the value of the excitation, as previously described.

In some examples, capacitors C21 and C22 of second sensor assembly 300-2 correspond to capacitors CTM and CBM of sensor assembly 200-1 respectively. Capacitors C23 and C24 of second sensor assembly 300-2 correspond to capacitors CTL and CTR of sensor assembly 200-1 respectively. Capacitors C25 and C26 of second sensor assembly 300-2 correspond to capacitors CBL and CBR of sensor assembly 200-1 respectively.

As one skilled in the art appreciates, the first sense assembly 300-1 is a rotated image of the second sense assembly 300-2. For example, if the construction of the first sense assembly 300-1 is compared with the second sense assembly 300-2 with reference to the anchor 304-1 and 304-2, the first sense assembly 300-1 is a rotated image of the second sense assembly 300-2. In some examples, the first sense assembly 300-1 and the second sense assembly 300-2 may be constructed such that the first sense assembly 300-1 is a mirror image of the second sense assembly 300-2. In other words, the location of the anchor 304-1, spring 306-1, anchor 304-2 and spring 306-2 will also form a mirror image.

Figure 3B:
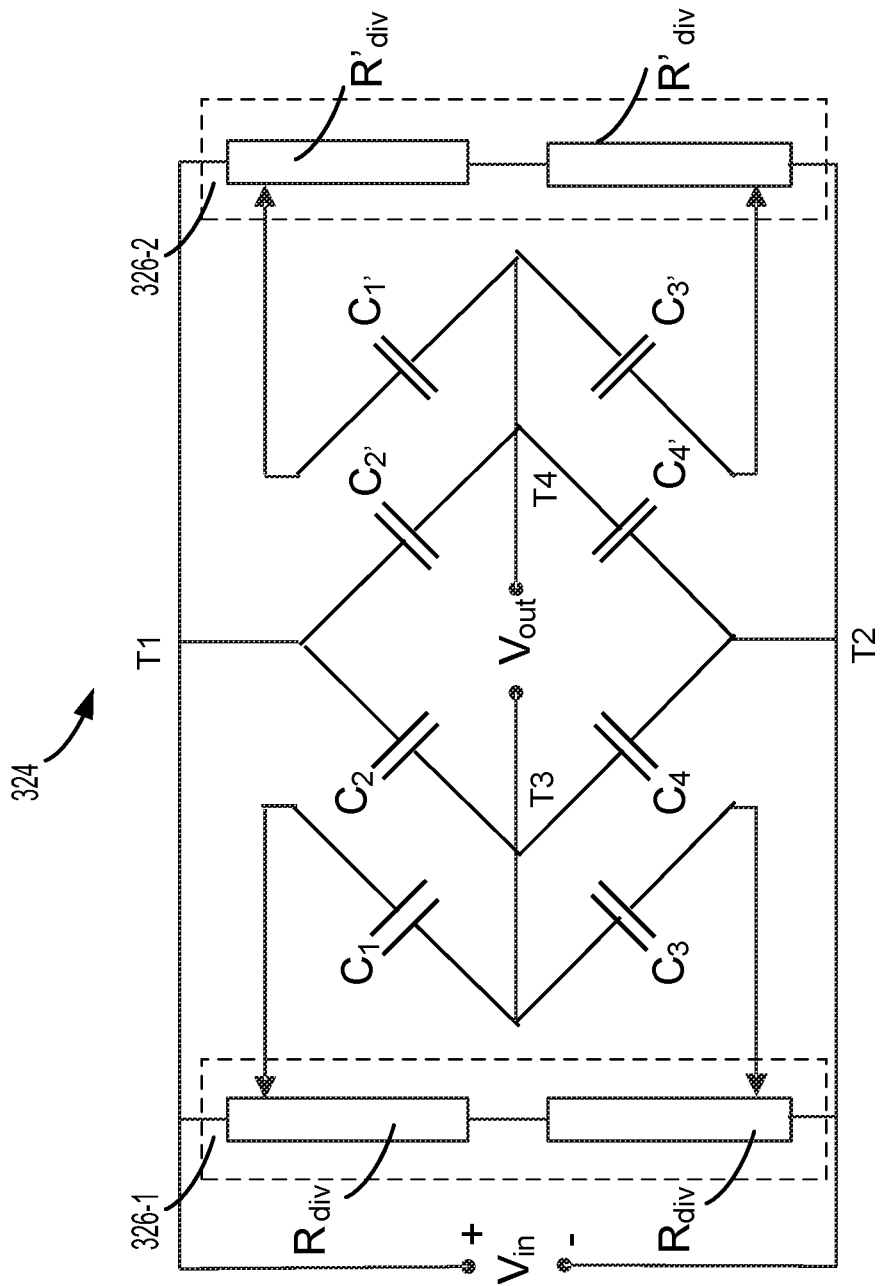
FIG. 3B shows an example full Wheatstone bridge configuration for sensors of sensor assembly of FIG. 3A, according to one aspect of the present disclosure.

Now, referring to FIG. 3B, a full Wheatstone bridge 324 is shown. In the full Wheatstone bridge, the capacitors C1, C2, C3 and C4 correspond to a half Wheatstone bridge 224 described with reference to FIG. 2B. Capacitors C1', C2', C3' and C4' form the other half of the full Wheatstone bridge 324. Capacitors of sensor assembly 300-1 are selectively configured to form a first subset of capacitors C1, C2, C3 and C4 of full Wheatstone bridge 324 and capacitors of sensor assembly 300-2 are selectively configured to form a second subset of capacitors C1', C2', C3' and C4' of full Wheatstone bridge 324. A first voltage divider 326-1 and a second voltage divider 326-2 may be used to selectively apply a portion of the input voltage Vin to a subset of the capacitors, as previously described with reference to FIG. 1E.

For example, the first subset of capacitors C1, C2, C3 and C4 may form two pairs of capacitor C1, C3 and C2, C4. The pair of capacitors C1 and C3 are connected in series. The pair of capacitors C2 and C4 are connected in series. Input voltage is applied across capacitors C2 and C4. A portion of the input voltage is applied across capacitors C1 and C3, using the first voltage divider 326-1. For example, the second subset of capacitors C1', CT, C3' and C4' may form two pairs of capacitor C1', C3' and C2', C4'. The pair of capacitors C1' and C3' are connected in series. The pair of capacitors C2' and C4' are connected in series. Input voltage is applied across capacitors CT2' and C4'. A portion of the input voltage is applied across capacitors C1' and C3', using the second voltage divider 326-2. The first voltage divider 326-1 and second voltage divider 326-2 may be similar to voltage divider 150 described with reference to FIG. 1D.

In some examples, input voltage Vin may be applied across terminal junction T1 and T2 and output voltage Vout may be measured across terminal junction T3 and T4. In this example, the first voltage divider 326-1 and second voltage divider 326-2 are between the input voltage source and the capacitor bridge. In some examples, the input voltage Vin may be applied across terminal junction T3 and T4 and output voltage Vout may be measured across terminal junction T1 and T2. In this example, the first voltage divider 326-1 and second voltage divider 326-2 are between the capacitor bridge and terminal junction T1 and T2 across which the output voltage Vout is measured.

Now, referring to table 330 of FIG. 3C, various selective configuration of capacitors C1, C2, C3 and C4 and capacitors C1', C2', C3' and C4' to measure excitation in different direction is shown. As one skilled in the art appreciates, a switch circuit may selectively couple capacitors C1, C2, C3 and C4 and capacitors C1', C2', C3' and C4' to measure excitation in different directions. Column 332 shows excitation measured. Column 334 shows terminal junction to which input voltage Vin is applied. Column 336 shows terminal junction used to measure output voltage Vout. Column 338-352 shows selective capacitor configuration for capacitors C1, C2, C3 and C4 and capacitors C1', CT2', C3' and C4' of the full Wheatstone bridge 324 shown in FIG. 3B, to measure a specific excitation along a given axis. As previously described, a ratio of Vout/Vin provides a value proportional to excitation along the selected axis.

For example, referring to row 354, acceleration Ax along X axis is measured, by selectively configuring capacitors C1, C2, C3 and C4 and capacitors C1', C2', C3' and C4'. For example, referring to row 354 and column 338, capacitor C23 of FIG. 3A is configured as capacitor C1 in the full Wheatstone bridge 324 of FIG. 3B. Similarly, referring to row 354 and column 348, capacitor C26 of FIG. 3A is configured as capacitor C3 in the full Wheatstone bridge 324 of FIG. 3B. Referring to columns 334 and 336, the input voltage Vin is applied across terminal junctions T1 and T2 and output voltage Vout is measured across terminal junctions T3 and T4.

For example, referring to row 356, acceleration Az along Z axis is measured, by selectively configuring capacitors C1, C2, C3 and C4 and capacitors C1', CT, C3' and C4'. For example, referring to row 356 and column 338, capacitor C11 of FIG. 3A is configured as capacitor C1 in the full Wheatstone bridge 324 of FIG. 3B. Similarly, referring to row 356 and columns 340, there is no connection (NC) for capacitor C2 in the full Wheatstone bridge 324 of FIG. 3B. Referring to columns 334 and 336, the input voltage Vin is applied across terminal junctions T1 and T2 and output voltage Vout is measured across terminal junctions T3 and T4.

For example, referring to row 358, magnetic excitation Bz along Z axis is measured, by selectively configuring capacitors C1, C2, C3 and C4 and capacitors C1', C2', C3' and C4'. For example, referring to row 358 and column 338, capacitor C11 of FIG. 3A is configured as capacitor C1 in the full Wheatstone bridge 324 of FIG. 3B. Similarly, referring to row 358 and column 348, there is no connection (NC) for capacitor C3 in the full Wheatstone bridge 324 of FIG. 3B. Referring to columns 334 and 336, the input voltage Vin is applied across terminal junctions T1 and T2 and output voltage Vout is measured across terminal junctions T3 and T4.

Now, referring back to rows 356 and 358, as one skilled in the art appreciates, by selectively coupling capacitors C11, C12, C21 and C22, we can measure either Az or Bz. In other words, two different types of excitation may be measured along the same axis (Axis Z here), by selectively configuring same sensing devices. Now, referring to FIG. 3D, a third sense circuit 370-1 to measure Az is described. Further, referring to FIG. 3E, a fourth sense circuit 370-2 to measure Bz is described. In some examples, the third sense circuit 370-1 may be similar to first sense circuit 130-1. In some examples, the fourth sense circuit 370-2 may be similar to second sense circuit 130-2.

Figure 3E:
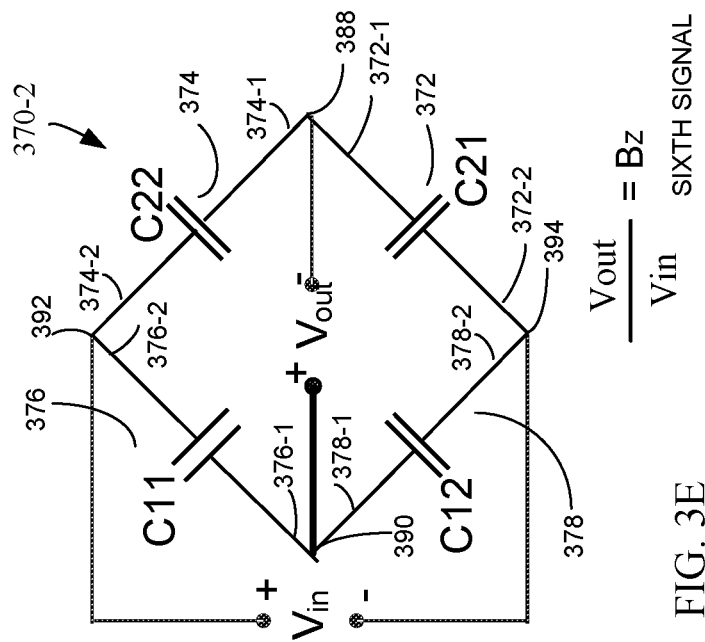
FIG. 3E shows an example fourth sense circuit to measure magnetic field along Z axis, according to one aspect of the present disclosure.
Figure 3D:
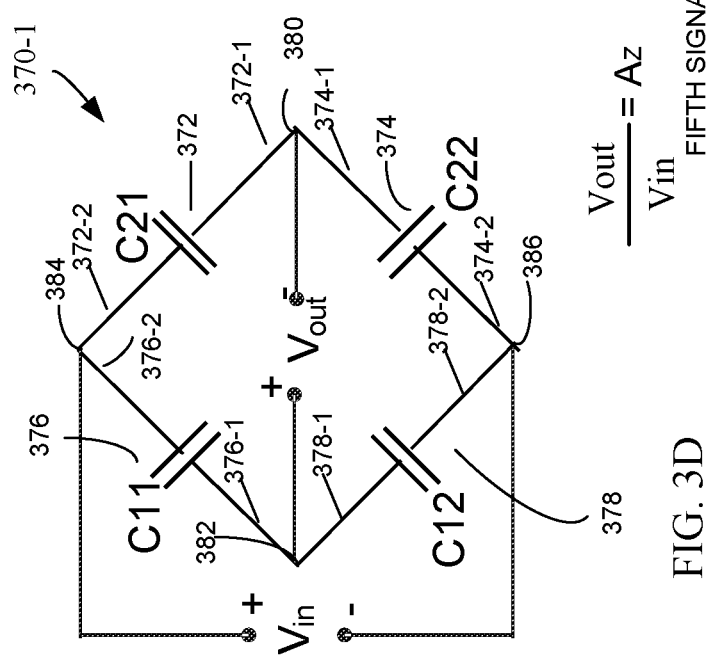
FIG. 3D shows an example third sense circuit to measure acceleration along Z axis, according to one aspect of the present disclosure.

Now, referring to FIG. 3D, an example third sense circuit 370-1 to measure a first excitation along Z axis is described. In this example, the first excitation along Z axis corresponds to acceleration Az. In this example, the fifth sensing device 372, sixth sensing device 374, seventh sensing device 376 and the eighth sensing device 378 are selectively coupled to form a Wheatstone bridge configuration. In one example, referring back to row 356 of table 330 of FIG. 3C, the fifth sensing device 372 corresponds to capacitor C21, sixth sensing device 374 corresponds to capacitor C22, seventh sensing device 376 corresponds to capacitor C11 and eighth sensing device 378 corresponds to capacitor C12.

More specifically, a first end 372-1 of the fifth sensing device 372 and a first end 374-1 of the sixth sensing device 374 are coupled together at a ninth junction 380. The first end 376-1 of the seventh sensing device 376 and the first end 378-1 of the eighth sensing device 378 are coupled together at a tenth junction 382. A second end 372-2 of the fifth sensing device 372 and a second end 376-2 of the seventh sensing device 372 are coupled together at eleventh junction 384. A second end 374-2 of the sixth sensing device 374 and a second end 378-2 of the eighth sensing device 378 are coupled together at twelfth junction 386.

An input voltage Vin is applied between the eleventh junction 384 and the twelfth junction 386. An output voltage Vout is measured between the ninth junction 380 and the tenth junction 382. In some examples, the fifth sensing device 372 and the sixth sensing device 374 may be part of the first MEMS sensor 102. In some examples, the seventh sensing device 376 and the eighth sensing device 378 may be part of the second MEMS sensor 104. A ratio of the output voltage Vout to input voltage Vin will provide a fifth signal, the value of which is indicative of the first excitation along the Z axis. For example, acceleration along the Z axis. In some examples, the Z axis may correspond to a fifth axis.

Now, referring to FIG. 3E, an example fourth sense circuit 370-2 to measure a second excitation along Z axis is described. In this example, the second excitation corresponds to a magnetic excitation, Bz. In this example, the fifth sensing device 372, sixth sensing device 374, seventh sensing device 376 and the eighth sensing device 378 are selectively coupled to form a Wheatstone bridge configuration. In one example, referring back to row 356 of table 330 of FIG. 3C, the fifth sensing device 372 corresponds to capacitor C21, sixth sensing device 374 corresponds to capacitor C22, seventh sensing device 376 corresponds to capacitor C11 and eighth sensing device 378 corresponds to capacitor C12.

More specifically, a first end 372-1 of the fifth sensing device 372 and a first end 374-1 of the sixth sensing device 374 are coupled together at a thirteenth junction 388. A first end 376-1 of the seventh sensing device 376 and a first end 378-1 of the eighth sensing device 378 are coupled together at a fourteenth junction 390. A second end 374-2 of the sixth sensing device 374 and a second end 376-2 of the seventh sensing device 376 are coupled together at a fifteenth junction 392. A second end 372-2 of the fifth sensing device 372 and a second end 378-2 of the eighth sensing device 378 are coupled together at a sixteenth junction 394.

An input voltage Vin is applied between the fifteenth junction 392 and the sixteenth junction 394. An output voltage Vout is measured between the thirteenth junction 388 and the fourteenth junction 390. In some examples, the fifth sensing device 372 and the sixth sensing device 374 may be part of the first MEMS sensor 102. In some examples, the seventh sensing device 376 and the eighth sensing device 378 may be part of the second MEMS sensor 104. A ratio of the output voltage Vout to input voltage Vin will provide a sixth signal, the value of which is indicative of the second excitation along the Z axis. For example, magnetic field along the Z axis. In some examples, the Z axis may correspond to a fifth axis.

Figure 4:
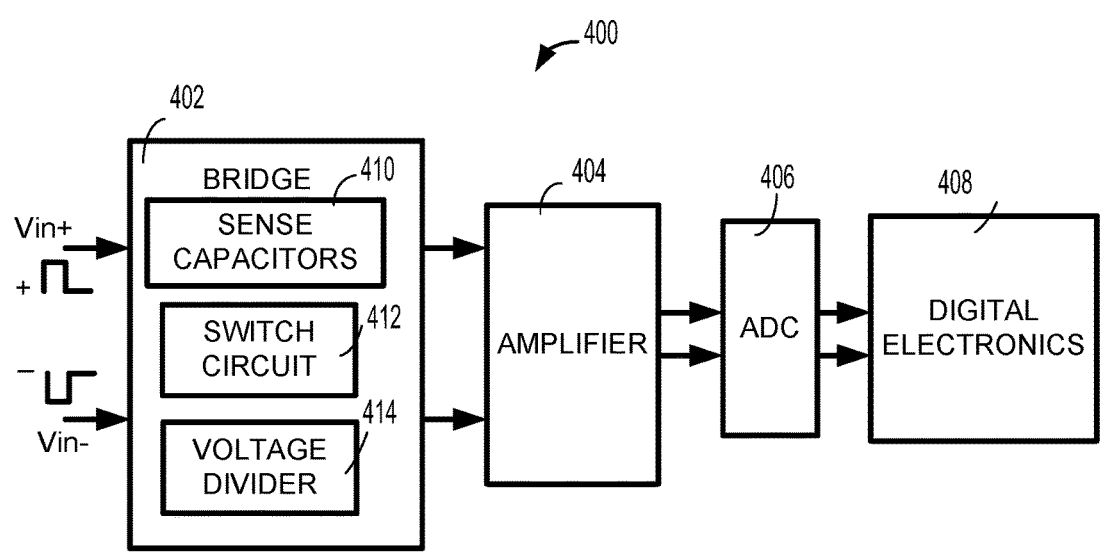
FIG. 4 shows an example sensing circuit, according to one aspect of the present disclosure.

Now, referring to FIG. 4, an example sensing circuit 400 is described. The sensing circuit 400 includes a capacitor bridge 402, a capacitance to voltage amplifier 404, an analog to digital converter (ADC) 406 and a digital electronics 408. The bridge 402 is shown coupled to the amplifier 404, which is shown coupled to the ADC 406, which is shown coupled to the digital electronics 408. The bridge 402 includes the sense capacitors 410, switch circuit 412 and voltage divider 414. The sense capacitors 410 may correspond to the capacitors, for example, shown with respect to FIG. 3A. The switch circuit 412 may selectively couple the sense capacitors to form a Wheatstone bridge configuration, for example, as shown with respect to table 330 of FIG. 3C. The voltage divider 414 applies a portion of the input voltage to the sense capacitors, for example, as described with reference to FIG. 3B.

In operation, out-of-phase voltage pulses are provided as input to the bridge 402 at Vin+ and Vin−. Output of the bridge 402 is converted to voltage by the amplifier 404 and the output of the amplifier 404 is converted from analog form to digital form by the ADC 406. The resulting digital signal is processed by digital electronics 408 to produce values for both acceleration and magnetic field. For example, the digital electronics 408 may generate a value indicative of the ratio of Vout/Vin.

In this disclosure, various sensing devices, for example, the first sensing device, second sensing device, third sensing device and fourth sensing device are described as a capacitive element, for example, variable capacitors. With variable capacitors, motion is detected as a change in capacitance. As one skilled in the art appreciates, in some examples, a different sensing device may be used to detect motion. For example, in some examples, a piezo-resistive element may be used as a sensing device. As one skilled in the art appreciates, piezo-resistive element may be configured to change its resistance upon detection of motion. These piezo-resistive elements may be configured as sensing devices and may be selectively configured in a Wheatstone bridge configuration to measure various excitations, as previously described in this disclosure.

In this disclosure, various elements are disclosed using terms like first, second, third, fourth and the like, to assist in describing the function and features of various combinations of elements with reference to different configurations and arrangements. Depending upon the context and the corresponding configurations and arrangements, some of these elements may be similar, but referenced as elements with different terms, to assist in describing the functions and features of various combinations and arrangements.

While embodiments of the present invention are described above with respect to what is currently considered its preferred embodiments, it is to be understood that the invention is not limited to that described above. To the contrary, the invention is intended to cover various modifications and equivalent arrangements within the spirit and scope of the appended claims.

What is claimed is:

1. A system , comprising:
   a sensor system, the sensor system comprising, a first MEMS sensor, a second MEMS sensor and a signal processor,
      wherein the sensor system is configured to be excited along a predefined first axis;
      wherein the first MEMS sensor has a first primary sense axis and is configured to output a first signal proportional to an excitation of the sensor system sensed along the first primary sense axis, the first primary sense axis different than the predefined first axis;
      wherein the first MEMS sensor is configured to move in response to a component of the excitation along the predefined first axis that is aligned with the first primary sense axis;
      wherein the second MEMS sensor has a second primary sense axis and is configured to output a second signal proportional to an excitation of the sensor system sensed along the second primary sense axis, the second primary sense axis different than the predefined first axis;

wherein the second MEMS sensor is configured to move in response to a component of the excitation along the first axis that is aligned with the second primary sense axis;

wherein, the first axis is predefined with reference to the first primary sense axis and the second primary sense axis;

wherein the signal processor is configured to combine the first signal and the second signal to output a third signal proportional to the excitation of the sensor system along the predefined first axis;

wherein the predefined first axis, the first primary sense axis and the second primary sense axis have different orientations; and wherein the first MEMS sensor is formed on a single crystal silicon and the predefined first axis corresponds to a high elastic modulus axis of the single crystal silicon.

2. The system of claim 1, wherein the sensor system is configured to be excited along a predefined second axis; wherein the predefined second axis is different than the predefined first axis, the first primary sense axis and the second primary sense axis; and the signal processor is configured to combine the first signal and the second signal to output a fourth signal proportional to the excitation along the predefined second axis, wherein, the second axis is predefined with reference to the first primary sense axis and the second primary sense axis.

3. The system of claim 2, wherein the component of excitation along the first primary sense axis or the component of excitation along the second primary sense axis is due to an acceleration along the predefined first axis or the predefined second axis respectively.

4. The system of claim 2, wherein the component of excitation along the first primary sense axis or the component of excitation along the second primary sense axis is due to an ambient magnetic field along the predefined first axis or the predefined second axis respectively.

5. The system of claim 2, wherein the predefined second axis is about 90 degrees rotated from the predefined first axis.

6. The system of claim 2, where the sense circuit further comprises a switch to select between first signal and the second signal.

7. The system of claim 1, wherein the first MEMS sensor includes a first sensing device and a second sensing device wherein the first sensing device and the second sensing device are configured to detect movement of the first MEMS sensor along the first primary axis; and wherein the second MEMS sensor includes a third sensing device and a fourth sensing device wherein the third sensing device and the fourth sensing device are configured to detect movement of the second MEMS sensor along the second primary axis.

8. The system of claim 7, wherein the first sensing device, the second sensing device, third sensing device and the fourth sensing device are variable capacitors or piezoresistive elements.

9. The system of claim 7, wherein the first sensing device, the second sensing device, the third sensing device and the fourth sensing device are selectively coupled in a Wheatstone bridge configuration by a switch circuit.

10. The system of claim 7, wherein the first sensing device and second sensing device share a common junction and are excited by a first voltage signal and the third sensing element and fourth sensing element share another common junction and is excited by a second voltage.

11. The system of claim 1, further comprising magnetic material disposed on the first MEMS sensor or the second MEMS sensor.

12. The system of claim 1, wherein the first MEMS sensor and the second MEMS sensor are acceleration sensors.

13. The system of claim 1, wherein the first MEMS sensor is a mirror image of the second MEMS sensor.

14. The system of claim 1, wherein the first MEMS sensor is a rotated image of the second MEMS sensor.

15. The system of claim 1, wherein the first primary sense axis is about 45 degree rotated from the predefined first axis and the second primary sense axis is about −45 degree rotated from the predefined first axis.

16. The system of claim 1, wherein the signal processor further comprises digital electronics to combine the first signal and the second signal.

17. A sensor system, comprising:
at least a first MEMS sensor assembly, a second MEMS sensor assembly and a signal processor, wherein, the sensor system is configured to be excited along a predefined first axis;

wherein, the first MEMS sensor assembly has at least a sense axis 1 and a sense axis 2, a first plurality of sensing devices of the first MEMS sensor assembly that is selectively configured to output a signal that is proportional to excitation along the sense axis 1, another plurality of sensing devices of the first MEMS sensor assembly that is selectively configured to output a signal that is proportional to excitation along the sense axis 2, the sense axis 1 different than the predefined first axis and the sense axis 2, and the sense axis 2 different than the predefined first axis;

wherein, the second MEMS sensor assembly has at least a sense axis 3 and a sense axis 4, a second plurality of sensing devices of the second MEMS sensor assembly that is selectively configured to output a signal that is proportional to excitation along the sense axis 3, another plurality of sensing devices of the second MEMS sensor assembly that is selectively configured to output a signal that is proportional to excitation along the sense axis 4, the sense axis 3 different than the predefined first axis and the sense axis 4, and the sense axis 4 different than the predefined first axis;

wherein, the first axis is predefined with reference to the sense axis 1 and the sense axis 2;

wherein, the predefined first axis, the sense axis 1 and the sense axis 3 all have different orientations or different physical excitations;

wherein the first MEMS sensor is formed on a single crystal silicon and the predefined first axis corresponds to a high elastic modulus axis of the single crystal silicon; and the signal processor configures the first plurality of sensing devices of the first MEMS sensor assembly and the second plurality of sensing devices of the second MEMS sensor assembly to output a first signal proportional to the excitation of the sensor system along the predefined first axis.

18. The system of claim 17, wherein the sensor system is configured to be excited along a plurality of axes, wherein the plurality of axes all have different orientations; and the signal processor configures the first plurality of sensing devices of the first MEMS sensor assembly and the second plurality of sensing devices of the second MEMS sensor assembly to output a signal proportional to the excitation of the sensor system along one of the plurality of axes.

19. The system of claim 17, wherein the sensor system is excited by acceleration in a x, y, or z directions, wherein the x, y and z directions are orthogonal to each other; and the signal processor selectively configures the first plurality of sensing devices of the first MEMS sensor assembly and the second plurality of sensing devices of the second MEMS sensor assembly to output a signal proportional to the excitation of the sensor system along one of the x, y or z directions.

20. The system of claim 17, wherein the sensor system is excited by magnetic field in the x, y or z directions, wherein the x, y and z directions are orthogonal to each other; and
the signal processor selectively configures the first plurality of sensing devices and second plurality of sensing devices to output a signal proportional to the excitation of the sensor system along one of the x, y or z directions.

21. The system of claim 17, wherein the first plurality of sensing devices of the first MEMS sensor assembly further comprises a first plurality of variable capacitors or piezo-resistive elements; and
the second plurality of sensing devices of the second MEMS sensor assembly further comprises a second plurality of variable capacitors or piezo-resistive elements.

22. The system of claim 21, wherein a first portion of the first plurality of variable capacitors or piezo-resistive elements of the first MEMS sensor assembly are configured to be excited by a first input voltage and a second portion of the first plurality of the variable capacitors or piezo-resistive elements of the first MEMS sensor assembly are configured to be excited by a second input voltage; and
wherein a first portion of the second plurality of variable capacitors or piezo-resistive elements of the second MEMS sensor assembly are configured to be excited by the first input voltage and a second portion of the second plurality of variable capacitors or piezo-resistive elements of the second MEMS sensor assembly are configured to be excited by the second input voltage.

23. A method for determining excitation imparted to a device, comprising:
providing a sensor system, the sensor system comprising, a first MEMS sensor, a second MEMS sensor and a signal processor;
exciting the sensor system along a predefined first axis, wherein the first MEMS sensor has a first primary sense axis, the first primary sense axis different than the predefined first axis and is configured to output a first signal proportional to an excitation of the sensor system along the first primary sense axis based on the excitation along the predefined first axis;
wherein the first MEMS sensor is configured to move in response to a component of the excitation along the first axis that is aligned with the first primary sense axis;
wherein the second MEMS sensor has a second primary sense axis, the second primary sense axis different than the predefined first axis and is configured to output a second signal proportional to an excitation of the sensor system along the second primary sense axis based on the excitation along the predefined first axis;
wherein the second MEMS sensor is configured to move in response to a component of the excitation along the predefined first axis that is aligned with the second primary sense axis;
wherein, the first axis is predefined with reference to the first primary sense axis and the second primary sense axis; and
wherein the first MEMS sensor is formed on a single crystal silicon and the predefined first axis corresponds to a high elastic modulus axis of the single crystal silicon; and
combining the first signal and the second signal by the signal processor to output a third signal proportional to the excitation of the sensor system along the predefined first axis, wherein the predefined first axis, the first primary sense axis and the second primary sense axis have different orientations.

24. The method of claim 23, further including:
exciting the sensor system along a predefined second axis, wherein the predefined second axis is different than the predefined first axis, the first primary sense axis and the second primary sense axis; and
combining the first signal and the second signal by the signal processor to output a fourth signal proportional to the excitation along the predefined second axis, wherein, the second axis is predefined with reference to the first primary sense axis and the second primary sense axis.

25. The method of claim 24, wherein the component of excitation along the first primary sense axis or the component of excitation along the second primary sense axis is due to an acceleration along the predefined first axis or the predefined second axis respectively.

26. The method of claim 24, wherein the component of excitation along the first primary sense axis or the component of excitation along the second primary sense axis is due to an ambient magnetic field along the predefined first axis or the predefined second axis respectively.

27. The method of claim 24, wherein the second axis is about 90 degrees rotated from the predefined first axis.

28. The method of claim 24, where the sense circuit further comprises a switch to select between the first signal and the second signal.

29. The method of claim 23, wherein the first MEMS sensor includes a first sensing device and a second sensing device wherein the first sensing device and the second sensing device detecting movement of the first MEMS sensor along the first primary sense axis; and
wherein the second MEMS sensor includes a third sensing device and a fourth sensing device wherein the third sensing device and the fourth sensing device detecting movement of the second MEMS sensor along the second primary sense axis.

30. The method of claim 29, wherein the first sensing device, the second sensing device, third sensing device and the fourth sensing devices are variable capacitors or piezo-resistive elements.

31. The method of claim 29, further including coupling the first sensing device, the second sensing device, the third sensing device and the fourth sensing device in a Wheatstone bridge configuration by a switch circuit.

32. The method of claim 29, wherein the first sensing device and second sensing device share a common junction and are excited by a first voltage signal and the third sensing device and fourth sensing device share another common junction and is excited by a second voltage.

33. The method of claim 23, further including, disposing magnetic material on the first MEMS sensor or the second MEMS sensor.

34. The method of claim 23, wherein the first MEMS sensor and the second MEMS sensor are acceleration sensors.

35. The method of claim 23, wherein the first MEMS sensor is a mirror image of the second MEMS sensor.

36. The method of claim 23, wherein the first MEMS sensor is a rotated image of the second MEMS sensor.

37. The method of claim 23, wherein the first primary sense axis is about 45 degree rotated from the predefined first axis and the second primary sense axis is about −45 degree rotated from the predefined first axis.

38. The method of claim 23, wherein the signal processor further comprises digital electronics to combine the first and second signal.

39. A method for a sensor system, comprising:
providing at least a first MEMS sensor assembly, a second MEMS sensor assembly and a signal processor;
exciting the sensor system along a predefined first axis,
  wherein, the first MEMS sensor assembly has at least a sense axis 1, the sense axis 1 different than the predefined first axis, and a sense axis 2, the sense axis 2 different than the predefined first axis and the sense axis 1, and a first plurality of sensing devices of the first MEMS sensor assembly that is selectively configured to output a signal that is proportional to excitation along the sense axis 1 or the sense axis 2;
  wherein, the second MEMS sensor assembly has at least a sense axis 3 and a sense axis 4 and a second plurality of sensing devices of the second MEMS sensor assembly that is selectively configured to output a signal that is proportional to excitation along the sense axis 3 or the sense axis 4;
  wherein, the first axis is predefined with reference to the sense axis 1 and the sense axis 2;
  wherein the first MEMS sensor is formed on a single crystal silicon and the predefined first axis corresponds to a high elastic modulus axis of the single crystal silicon; and
  wherein, the predefined first axis, the sense axis 1 and the sense axis 3 all have different orientations or different physical excitations; and
  configuring the first plurality of sensing devices of the first MEMS sensor assembly and the second plurality of sensing devices of the second MEMS sensor assembly by the signal processor to output a first signal proportional to the excitation of the sensor system along the predefined first axis.

40. The method of claim 39, further including:
exciting the sensor system along a plurality of axes, wherein the plurality of axes all have different orientations; and
configuring the first plurality of sensing devices of the first MEMS sensor assembly and the second plurality of sensing devices of the second MEMS sensor assembly by the signal processor to output a signal proportional to the excitation of the sensor system along one of the plurality of axes.

41. The method of claim 39, further including:
exciting the sensor system by acceleration in a x, y, or z directions, wherein the x, y and z directions are orthogonal to each other; and
selectively configuring the first plurality of sensing devices of the first MEMS sensor assembly and the second plurality of sensing devices of the second MEMS sensor assembly by the signal processor to output a signal proportional to the excitation of the sensor system along one of the x, y or z directions.

42. The method of claim 39, further including:
exciting the sensor system by magnetic field in the x, y or z directions, wherein the x, y and z directions are orthogonal to each other; and
selectively configuring the first plurality of sensing devices and second plurality of sensing devices by the signal processor to output a signal proportional to the excitation of the sensor system along one of the x, y or z directions.

43. The method of claim 39, wherein the first plurality of sensing devices of the first MEMS sensor assembly further comprises a first plurality of variable capacitors or piezo-resistive devices and wherein the second plurality of sensing devices of the second MEMS sensor assembly further comprises a second plurality of variable capacitors or piezo-resistive elements.

44. The method of claim 43, wherein a first portion of the first plurality of variable capacitors or piezo-resistive elements of the first MEMS sensor assembly are configured to be excited by a first input voltage and a second portion of the first plurality of the variable capacitors or piezo-resistive elements of the first MEMS sensor assembly are configured to be excited by a second input voltage; and
  wherein a first portion of the second plurality of variable capacitors or piezo-resistive elements of the second MEMS sensor assembly are configured to be excited by the first input voltage and a second portion of the second plurality of variable capacitors or piezo-resistive elements of the second MEMS sensor assembly are configured to be excited by the second input voltage.

* * * * *